United States Patent
Yoneda

[11] Patent Number: 6,049,122
[45] Date of Patent: Apr. 11, 2000

[54] FLIP CHIP MOUNTING SUBSTRATE WITH RESIN FILLED BETWEEN SUBSTRATE AND SEMICONDUCTOR CHIP

[75] Inventor: Yoshihiro Yoneda, Kawasaki, Japan

[73] Assignee: Fujitsu Limited, Kawasaki, Japan

[21] Appl. No.: 09/136,424

[22] Filed: Aug. 20, 1998

[30] Foreign Application Priority Data

Oct. 16, 1997 [JP] Japan ................................ 9-284025

[51] Int. Cl.$^7$ ................................................ H01L 23/495
[52] U.S. Cl. .................... 257/668; 257/778; 257/737; 257/701; 257/678; 257/780; 438/108; 438/127
[58] Field of Search .................................. 257/678, 676, 257/688, 778, 780, 786, 737, 738, 668, 701; 438/108, 127

[56] References Cited

U.S. PATENT DOCUMENTS

| | | | |
|---|---|---|---|
| 5,683,942 | 11/1997 | Kata et al. | 438/118 |
| 5,710,071 | 1/1998 | Beddingfield et al. | 438/108 |
| 5,869,886 | 2/1999 | Tokuno | 257/678 |

FOREIGN PATENT DOCUMENTS

| | | |
|---|---|---|
| 8-181239 | 7/1996 | Japan . |
| 8-097313 | 12/1996 | Japan . |

OTHER PUBLICATIONS

U.S. application No. 09/034,799, Sohara et al., filed Mar. 4, 1998.

*Primary Examiner*—Tom Thomas
*Assistant Examiner*—Luan Thai
*Attorney, Agent, or Firm*—Staas & Halsey LLP

[57] ABSTRACT

A semiconductor device and method to control generation of a void within resin during supply to an area between a semiconductor chip and a substrate body. The substrate body includes a wiring layer which is connected to an external bump through internal wiring. Solder resist is formed on the substrate body and an aperture in the solder resist exposes a plurality of pads to electrically connect with the semiconductor chip. During loading of the semiconductor chip, the resin is supplied to the aperture. The aperture is formed in a circumferential shape to control generation of the void.

15 Claims, 14 Drawing Sheets

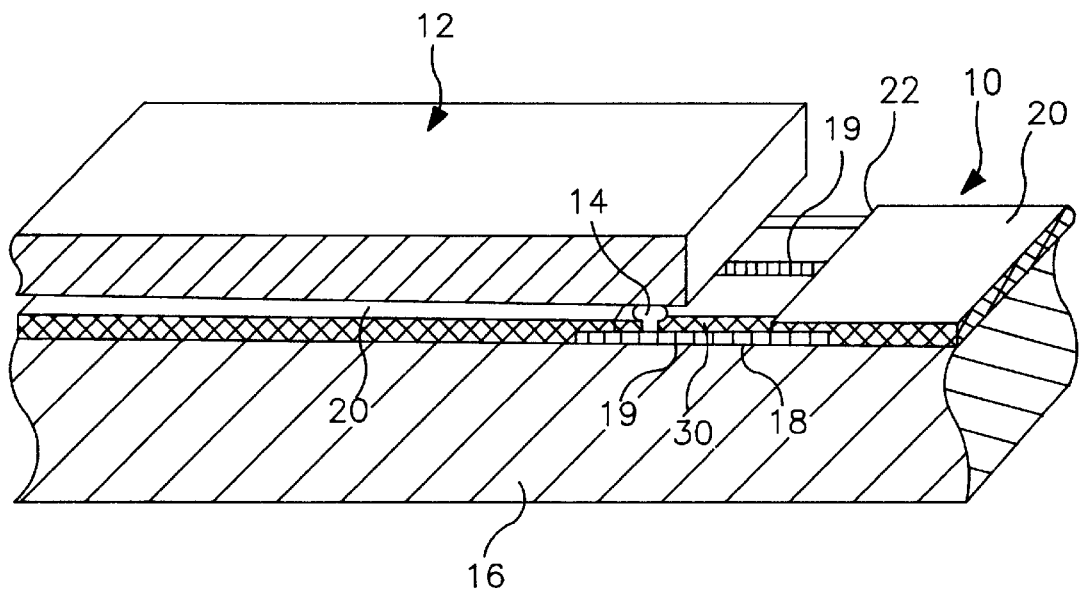
FIG. IA
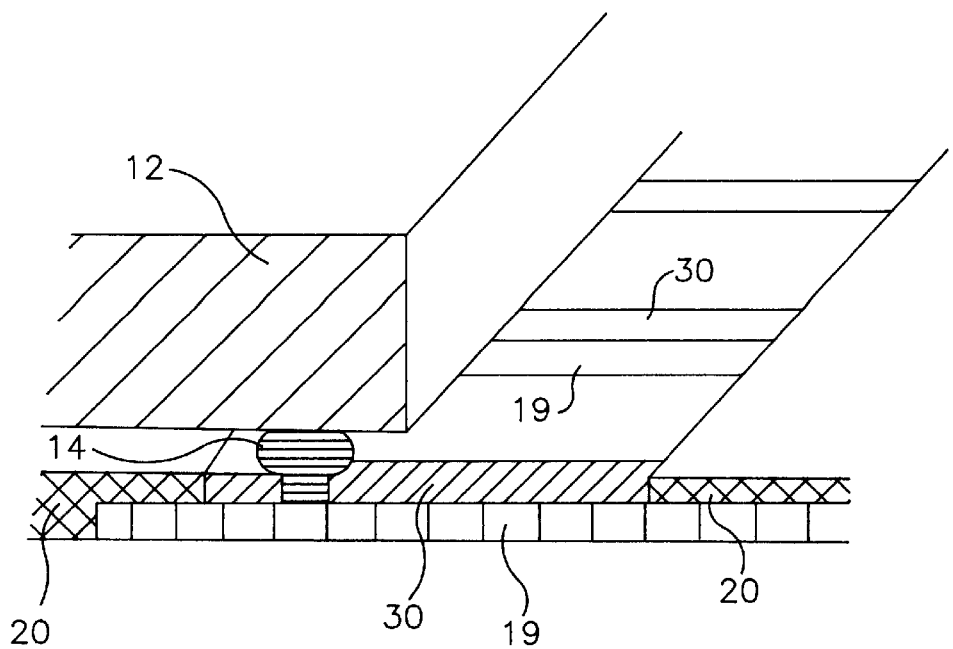
FIG. IB

FLIP CHIP MOUNTING SUBSTRATE WITH RESIN FILLED BETWEEN SUBSTRATE AND SEMICONDUCTOR CHIP

CROSS-REFERENCE TO RELATED APPLICATIONS

This application is based upon and claims priority of Japanese Patent Application No. 09-284025, the contents being incorporated herein by reference.

BACKGROUND OF THE INVENTION

The present invention relates to a semiconductor device and a semiconductor chip mounting substrate. More particularly, the present invention relates to a flip chip mounting substrate, wherein an area between a semiconductor chip and the flip chip mounting substrate, under the semiconductor chip, is filled with resin. The present invention also relates to a flip chip mounting structure.

In recent years, semiconductor devices have been increasingly incorporated within a variety of electronic devices. The electronic devices have demonstrated a corresponding increase in reliability, thereby enhancing the need for incorporation of semiconductor devices in a number of products.

In general, a semiconductor device has a structure in which a semiconductor chip is mounted on a substrate. Along with a reduction in size and packing density of semiconductor chips, a flip chip mounting method has been introduced in which projected electrodes are used in conjunction with a semiconductor chip to mount the semiconductor chip on the surface of the substrate.

FIGS. 10 through 13 are related to the present invention and illustrate a flip chip mounting substrate which lays a foundation for the present invention. FIGS. 10 through 13 illustrate a flip chip mounting substrate 100 and a mounting structure for mounting a surface mounting element on the flip chip mounting substrate 100. Semiconductor chip 102 is considered as an example for use with flip chip mounting substrate 100.

FIGS. 10 through 13 are related, with FIG. 10 illustrating a side sectional view of semiconductor chip 102 mounted on flip chip mounting substrate 100; FIG. 11 illustrating a side sectional view of an under-fill resin 118 formed with semiconductor chip 102 of FIG. 10; FIG. 12 illustrating an exploded perspective view of flip chip mounting substrate 100; and FIG. 13 illustrating a plan view of flip chip mounting substrate 100. According to the following explanation, flip chip mounting substrate 100 is applied to a semiconductor device having a Ball Grid Array ("BGA") structure.

As illustrated in FIG. 10, mounting substrate 100 includes a substrate body 106 and a solder resist 110. The substrate body 106 is, for example, a multilayer printed wiring board. A bump for external connection 114 (see FIG. 12) is formed at a lower surface of substrate body 106 and a pad 109 is formed at an upper surface of substrate body 106. Pad 109 and the external connection bump 114 are connected through a wiring layer 108 and an interlayer wiring (not illustrated) which is formed in substrate body 106.

Solder resist 110, which is an insulation film formed of an insulation resin, is disposed on flip chip mounting substrate 100. Solder resist 110 prevents incorrect mounting of semiconductor chip 102 and pad 109 at an area other than a predetermined connecting position.

As illustrated in FIG. 10, solder resist 110 is provided with a rectangular aperture 112 at a position corresponding to gold bump 104. The gold bump 104 is formed on semiconductor chip 102.

As illustrated in FIG. 12, each rectangular aperture 112 is not continuous and is therefore independent of other rectangular apertures. As illustrated, gold bump 104 may be part of a group of bumps 104 for placement within corresponding rectangular apertures 112. In more practical terms, a corner portion 122, which is formed as a part of solder resist 110, is provided between the adjacent apertures 112, and thereby each aperture 112 is respectively independent. Moreover, the forming position of aperture 112 has been set at an internal side of a predetermined external circumference 113 (a position indicated by a broken line in FIG. 12) of semiconductor chip 102, when the semiconductor chip 102 is mounted to mounting substrate 100. Gold bump 104, explained above, is arranged at a peripheral area of semiconductor chip 102.

The junction position of gold bump 104 with pad 109 is exposed by forming aperture 112 in solder resist 110. Thus, gold bump 104 and pad 109 can be electrically connected.

As illustrated in FIGS. 10 and 11, gold bump 104 is joined by solder 116 on pad 109 when semiconductor chip 102 is mounted to mounting substrate 100. As illustrated in FIG. 11, under-fill resin 118 is applied to an area between semiconductor chip 102 and mounting substrate 100. This under-fill resin 118 is provided to ease stress which is generated by a difference in thermal expansion between semiconductor chip 102 and flip chip mounting substrate 100, and to protect a joining area between gold bump 104 and pad 109.

This under-fill resin 118 is provided between semiconductor chip 102 and mounting substrate 100 after the semiconductor chip 102 is joined to pad 109 using solder 116.

In more practical terms, under-fill resin 118 is a fluid which is supplied to an area between semiconductor chip 102 and mounting substrate 100 before hardening. Thereafter, under-fill resin 118 is hardened by heat treatment.

Aperture 112, within solder resist 110, is preferably formed to pad 109 from the viewpoint of the function. However, when the pitch of gold bump 104 becomes as narrow as 200 m, due to an increase in a number of pins of semiconductor chip 102, it is difficult to form a corresponding aperture within solder resist 110.

Therefore, aperture 112 is formed for every line of gold bump 104 at one side of semiconductor chip 102, and aperture 112 is formed in a rectangular shape. Accordingly, four apertures are formed in a rectangular shape because the gold bump 104 is peripherally arranged as a plurality of gold bumps 104, as illustrated in FIG. 12.

However, when semiconductor chip 102 is mounted using the mounting substrate 100 of the existing structure explained above, there arises a problem in that void 120 (see FIG. 11) is generated in under-fill resin 118, provided between the semiconductor chip 102 and mounting substrate 100.

When void 120 is generated in under-fill resin 118, as explained above, solder 116 flows into void 120, resulting in the probability of a short-circuit to an adjacent gold bump 104. Moreover, when under-fill resin 118 is heated, water content in void 120 is expanded. This results in a potential that a crack may be generated in under-fill resin 118 or a connection between the gold bump 104 and pad 109 may be broken.

As set forth below, the inventors of the present invention have discovered a reason why the void is generated in the under-fill resin 118 when mounting substrate 100 of the structure of the related art is used.

FIG. 14 through FIG. 16 illustrate a change of conditions with respect to time where a fluid form of under-fill resin 118 is supplied to an area between semiconductor chip 102 and mounting substrate 100. Each figure respectively illustrates enlargement of a corner part of the mounting substrate. Under-fill resin 118 is supplied toward a lower direction from an upper side of each figure.

The inventors of the present invention have conducted an experiment to determine how the flow of under-fill resin 118 varies with respect to time by supplying under-fill resin 118 to an area between semiconductor chip 102 and mounting substrate 100.

As a result, it has been proven that a flowing rate of under-fill resin 118 on the mounting substrate 100 is different depending on a place of application, as illustrated in FIG. 14. Namely, it has been proven that a first flow rate (indicated by the arrow V1 in FIG. 14) of under-fill resin 118 on the solder resist is high, while a second flow rate (indicated by the arrow V2 in FIG. 14) in aperture 112 is low.

There are essentially two reasons for a higher flow rate of under-fill resin 118 on solder resist 110. First, the solder resist 110 is also a resin (like the under-fill resin 118) and therefore has good wettability, and second, since the upper surface of the solder resist 110 is formed as a smooth surface, flow of the under-fill resin 118 is not restricted by many factors.

Meanwhile, under-fill resin 118 in the aperture 112 is thought to flow at a lower rate V2 because of the following reasons. One reason is that since the projected and recessed areas are formed on pad 109 within the aperture 112, these projected and recessed areas interfere with flow of the under-fill resin 118. Another reason is that since the space of the aperture 112 is larger than the upper part of the solder resist 110, an effect of capillarity is lowered and friction for interfering flow of the under-fill resin 118 becomes large.

As explained above, when the flow rate V1 of the under-fill resin 118 on the solder resist 110 is higher than the flow rate V2 of the under-fill resin 118 within the aperture 112, the under-fill resin 118 flowing on the solder resist 110 at the higher flow rate V1 generates a secondary flow (this flow is indicated by the arrows A in FIG. 15) to turn around the aperture 112 in an area near an end part of aperture 112.

However, since the under-fill resin 118 flows at a lower rate in the aperture 112 as explained above, a space (i.e. void) is generated in a forming part of the aperture 112 (particularly at the end part of the aperture 112). In this case, according to the related art, since the forming position of aperture 112 has been set at a more internal side than a external circumference position, indicated by broken line 113, in the mounting condition, an escaping route of this void is closed by the under-fill resin 118 flowing from an external side position of the aperture 112 and thereby the position of the space (void) is formed on the aperture 112.

Moreover, when the under-fill resin 118 further flows, the under-fill resin 118 exists continuously in the area leaving a space as illustrated in FIG. 16, and thereby void 120 is formed on the aperture.

BRIEF SUMMARY OF THE INVENTION

It is therefore an object of the present invention to address the above-mentioned problems and improve reliability of a semiconductor device using a flip chip mounting substrate.

It is a further object of the present invention to provide a semiconductor flip chip mounting substrate which can control or reduce the generation of a void within under-fill resin when an area between a semiconductor chip and a flip chip mounting substrate is filled with resin.

Objects of the invention are achieved by a semiconductor device to receive a chip having an outer circumference which defines a chip external position, including a substrate having first and second surfaces with an external terminal formed on the first surface; a plurality of pads disposed on the second surface and electrically connected to the external terminal; and an insulation layer formed on a part of the pads and defining an aperture to expose a portion of the pads for electrical connection with the chip, wherein the aperture is formed across the chip external position.

Further objects of the invention are achieved by a semiconductor substrate to receive a chip having an outer circumference which defines a chip external position on the semiconductor substrate, including an external terminal formed on a first surface of the semiconductor substrate; a plurality of pads disposed on a second surface of the semiconductor substrate and electrically connected to the external terminal; and an insulation layer formed on a part of the pads and defining an aperture to expose a portion of the pads for electrical connection with the chip, wherein the aperture is formed across the chip external position.

Even further objects of the invention are achieved by a semiconductor device to receive a chip having an outer circumference which defines a chip external position, including a substrate having first and second surfaces with an external terminal formed on the first surface; a plurality of pads disposed on the second surface and electrically connected to the external terminal; an insulation layer formed on a part of the pads and defining an aperture to expose a portion of the pads for electrical connection with the chip, the aperture defining a ring which separates the insulation layer into a first insulation layer portion and a second insulation layer portion; and an underfill resin injected between the substrate and the chip, wherein the aperture is formed across the chip external position such that the underfill resin does not form a void during injection between the substrate and the chip.

Moreover, objects of the invention are achieved by a semiconductor device to receive a chip having an outer circumference which defines a chip external position, including a substrate having first and second surfaces with an external terminal formed on the first surface; a plurality of pads disposed on the second surface and electrically connected to the external terminal; an insulation layer formed on a part of the pads and defining first and second aperture to expose a first portion and a second portion of the pads for electrical connection with the chip; and an underfill resin injected between the substrate and the chip, wherein the first and second apertures are formed across the chip external position such that the underfill resin does not form a void during injection between the substrate and the chip.

Further objects of the invention are achieved by a semiconductor device to receive a chip having an outer circumference which defines a chip external position, including a substrate having first and second surfaces with an external terminal formed on the first surface; a plurality of pads disposed on the second surface and electrically connected to the external terminal; an insulation layer formed on a part of the pads and defining a plurality of apertures with each aperture exposing a corresponding pad of the plurality of pads; and an underfill resin injected between the substrate and the chip, wherein the plurality of apertures are formed across the chip external position such that the underfill resin does not form a void during injection between the substrate and the chip.

BRIEF DESCRIPTION OF THE DRAWING

These and other objects and advantages of the present invention will become apparent and more readily appreciated from the following description of the preferred embodiments, taken in conjunction with the accompanying drawing of which:

FIG. 1A is a cross-sectional view of a semiconductor chip mounted on a flip chip mounting substrate according to a preferred embodiment of the present invention.

FIG. 1B is an enlarged view of the semiconductor chip mounted on a flip chip mounting substrate shown in FIG. 1A according to a preferred embodiment of the present invention.

DETAILED DESCRIPTION OF THE PREFERRED EMBODIMENTS

Figure 2:
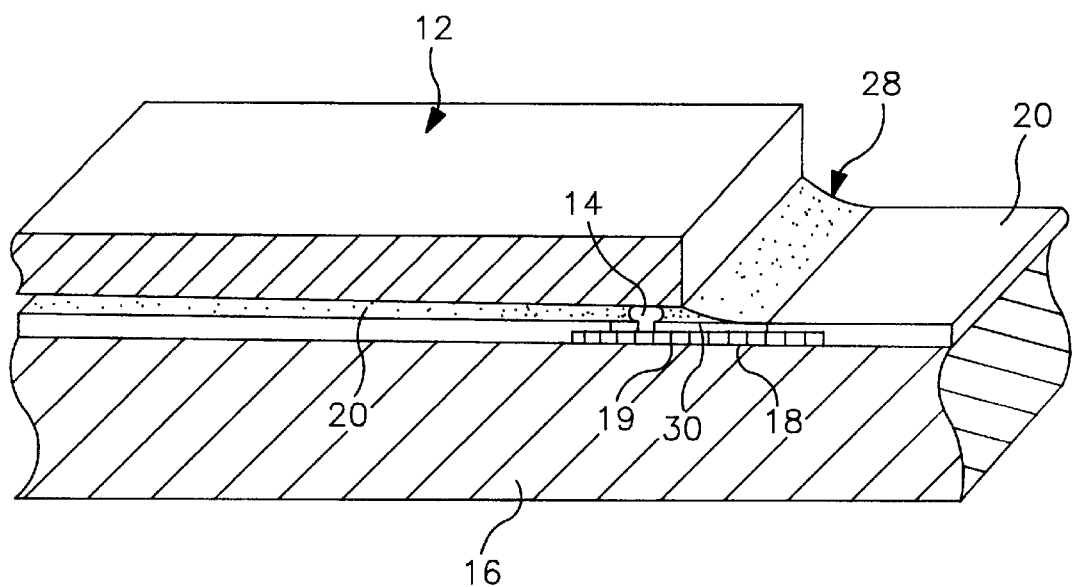
FIG. 2 is a cross-sectional view of a semiconductor chip mounted with an under-fill resin on a flip chip mounting substrate according to a preferred embodiment of the present invention.

Reference will now be made in detail to the preferred embodiments of the present invention, examples of which are illustrated in the accompanying drawings, wherein like reference numerals refer to like elements throughout.

Figure 3:
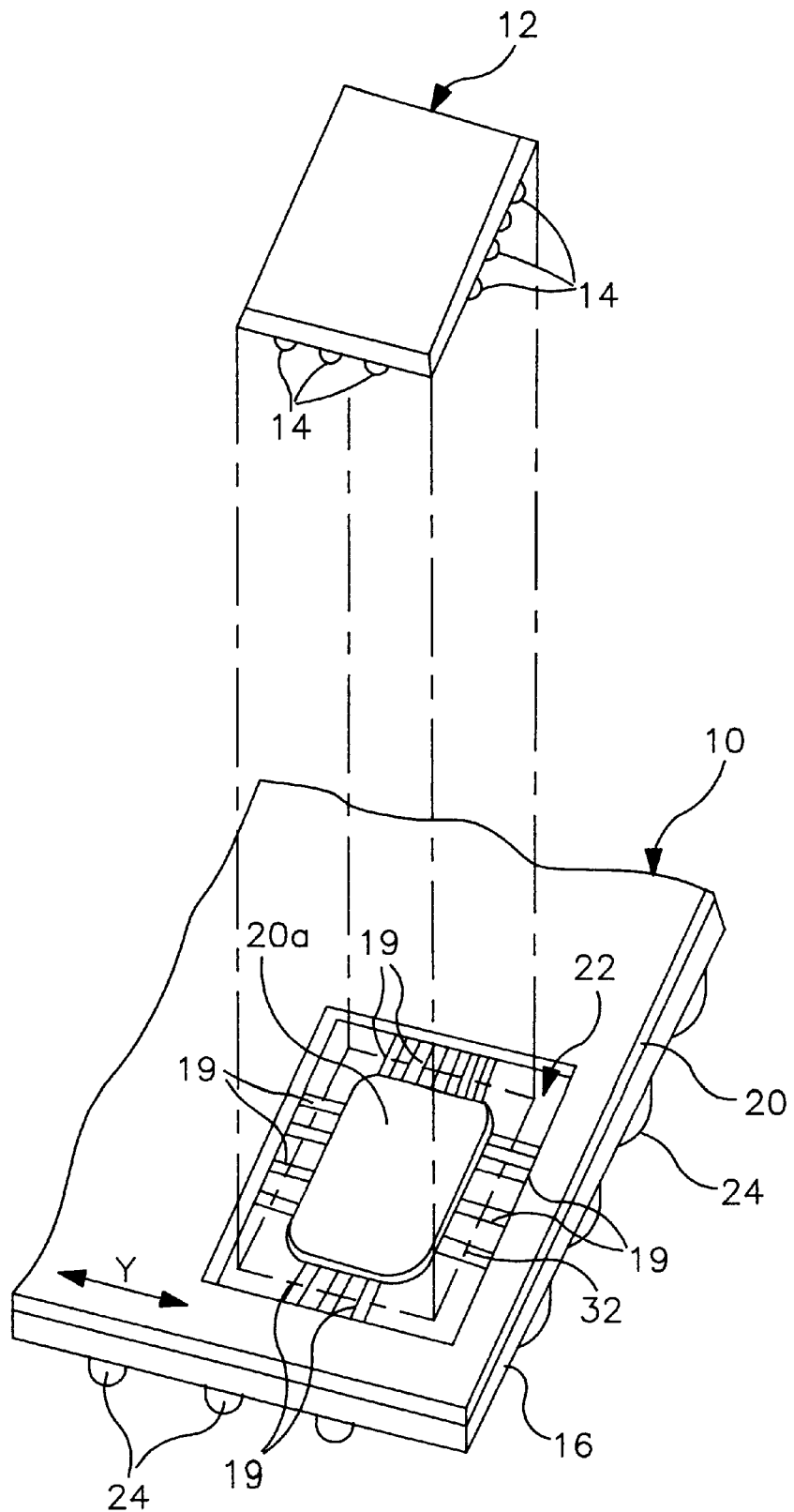
FIG. 3 is an exploded perspective view of a semiconductor chip mounted on a flip chip mounting substrate according to a preferred embodiment of the present invention.

FIG. 1 through FIG. 4 illustrate a semiconductor chip mounting substrate 10 (hereinafter referred to as mounting substrate 10) according to a preferred embodiment of the present invention. In particular, FIG. 1A is a cross-sectional view of semiconductor chip 12 mounted as a surface mounting element; FIG. 1B is an enlarged view of the semiconductor chip 12 mounted as shown in FIG. 1A; FIG. 2 is a cross-sectional view illustrating formation of under-fill resin 28; FIG. 3 is an exploded perspective view of mounting substrate 10; and FIGS. 4A–4C are plan views of mounting substrate 10.

In the following explanation, mounting substrate 10 is applied, as an example, to a semiconductor device of a Ball Grid Array ("BGA") structure, however, the present invention can be equally applied to a Multi Chip Module ("MCM") structure as well.

The mounting substrate 10 includes substrate body 16 and solder resist 20, which will become an insulation film. Substrate body 16 is, for example, a single layer or a multilayer printed wiring substrate formed of a low price material such as Glass-Epoxy. Therefore, cost of the mounting substrate 10 can be reduced.

At the lowest surface of the substrate body 16, an external connection bump 24 (see FIG. 3) is formed. External connection bump 24 has a structure such that a solder ball is arranged as an electrode pad (not illustrated) formed at a lowest surface of substrate body 16.

Moreover, at an upper surface of substrate body 16, a pad 19 is formed according to a predetermined wiring pattern. Pad 19 and external connection bump 24 are connected by an interlayer wiring (not illustrated) formed within substrate body 16. Moreover, a mounting pad is formed on wiring layer 18, which is in turn joined to gold bump 14, as will be explained later.

The solder resist 20 is an insulation resin and is formed on an upper surface of substrate body 16. Solder resist 20 is provided such that the semiconductor chip 12 and pad 19 are terminated at a position other than the predetermined connecting position.

However, since the semiconductor chip 12 must be connected electrically to the pad 19, the solder resist 20 is provided with an aperture 22. Since the aperture 22 is formed within solder resist 20, as explained above, the pad 19 formed to the mounting substrate 10 can be exposed. Therefore, the semiconductor chip 12 can be electrically connected to the pad 19. For the convenience of explanation, details of this aperture 22 will be addressed later.

Meanwhile, the semiconductor chip 12 is provided with a plurality of gold bumps 14 (see FIG. 3) at a circuit forming surface (lower surface in the figure). In this embodiment, gold bumps 14 are arranged in the peripheral area (in an annular line along the external circumference of the semiconductor chip) with wire bonding technology. This semiconductor chip 12 is then joined to the mounting substrate 10 by the flip chip connecting method.

As shown in FIG. 1, under the condition that the semiconductor chip 12 is joined to the mounting substrate 10 by the flip chip connecting method, the illustrated gold bump 14 is joined by solder 30 to pad 19. Upon mounting semiconductor chip 12 to semiconductor chip mounting substrate 10, the solder 30 (preferably having a composition of 96.5% Sn and 3.5% Ag) is precoated to the pad 19.

FIG. 2 is an enlarged view particularly illustrating solder 30. As explained above, pad 19 (joining a position with the gold bump 14) is exposed to by aperture 22. In this case, pad 19 is linearly formed with uniform width. The solder 30 is formed to a portion of pad 19 which is exposed from aperture 22. The gold bump 14 is connected, when heated, by the fused solder 30 and is then fixed upon cooling.

As explained above, since pad 19 is arranged in aperture 22 and is linearly formed with a uniform width, the quantity and height of the solder itself can be formed uniformly. Moreover, since the circumference of aperture 22 is extended, the solder 30 can be arranged in a wider area and a fluctuation in height of the solder 30 can be reduced. Moreover, since a wide soldering area can be obtained by providing a longer aperture wiring layer of uniform width, generation of fluctuation in height of the precoated solder can be prevented and the coupling property with the surface mounting element can also be improved.

In more detail, if the solder 30 is arranged within a narrow area, a change in an amount of solder 30 appears as a change in height of solder 30. On the other hand, when the solder 30 is arranged in a wider area, if an amount of solder 30 changes, a change in the height of solder 30 may be reduced.

Therefore, fluctuation in the height of solder 30 may be controlled by providing the solder 30 to a wider area, for example, 60–80 m(width) 500–600 m(length), and thereby the coupling property between semiconductor chip 12 and pad 19 can be improved.

Moreover, the under-fill resin 28 is mounted between semiconductor chip 12 and mounting substrate 10. For this under-fill resin 28, the epoxy-based insulation resin is selected and a fluid resin having a property of lower viscosity before hardening is selected.

Since the under-fill resin 28 is provided between semiconductor chip 12 and mounting substrate 10, stress generated because of a difference in thermal expansion between semiconductor chip 12 and mounting substrate 10 may be eased and a joining point of gold bump 14 and pad 19 can be protected to improve reliability of the loading.

This under-fill resin 28 is mounted between semiconductor chip 12 and mounting substrate 10 after semiconductor chip 12 is joined to pad 19 using solder 30. More particularly, the under-fill resin 28 is formed as a fluid before hardening to the area between semiconductor chip 12 and mounting substrate 10. The under-fill resin 28 is then hardened through heat treatment.

Figure 4A:
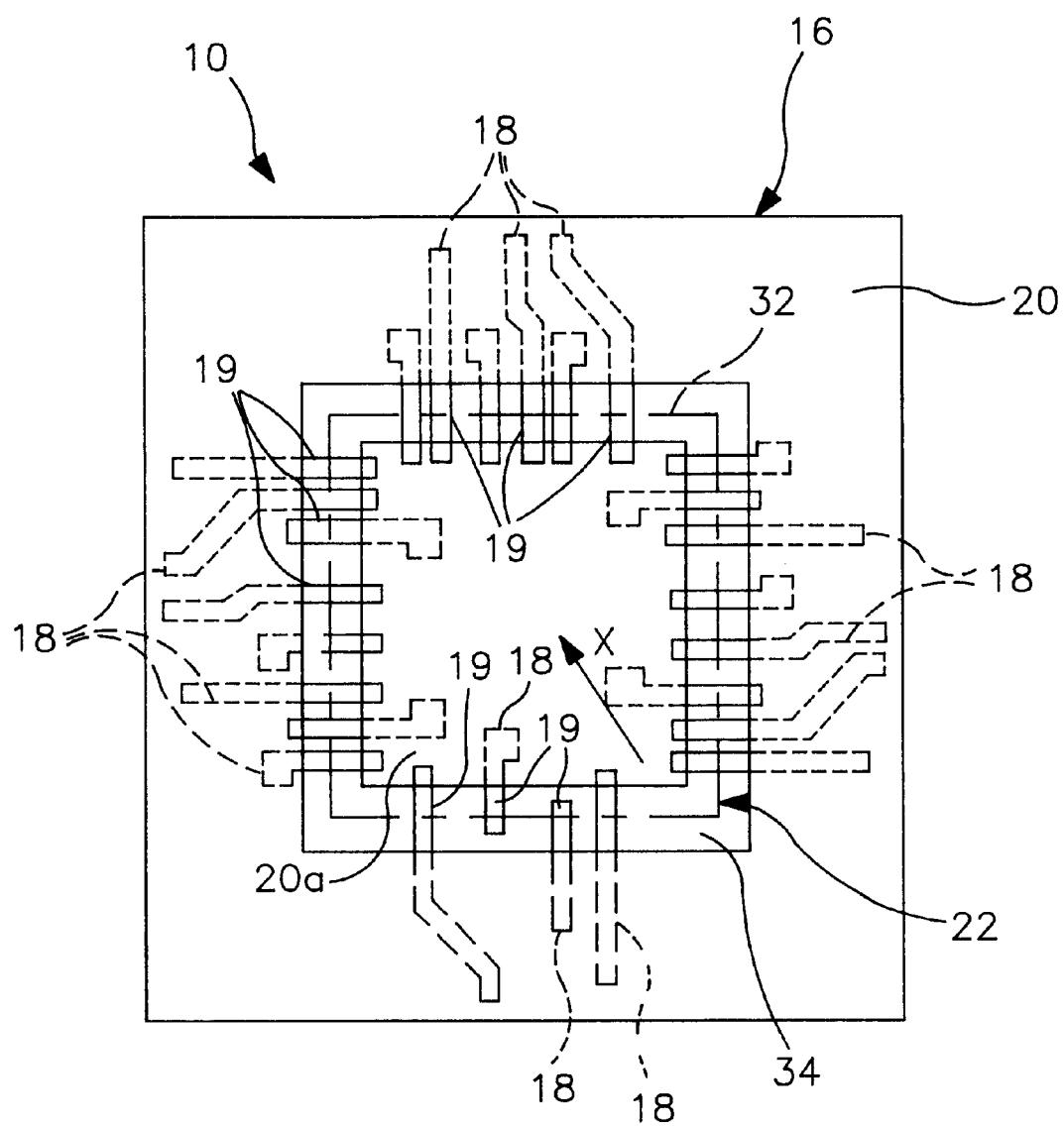
FIGS. 4A–4C are respective plan views of a flip chip mounting substrate according to preferred embodiments of the present invention.

Turning now to FIG. 4A, aperture 22 will now be explained in detail. The embodiment illustrated in FIG. 4A is characterized in that an aperture 22 is formed by removing the solder resist 20 in an approximate circumferential rectangular shape. Therefore, pad 19 (a position for connection with semiconductor chip 12) is exposed to an external side via aperture 22.

Figure 12:
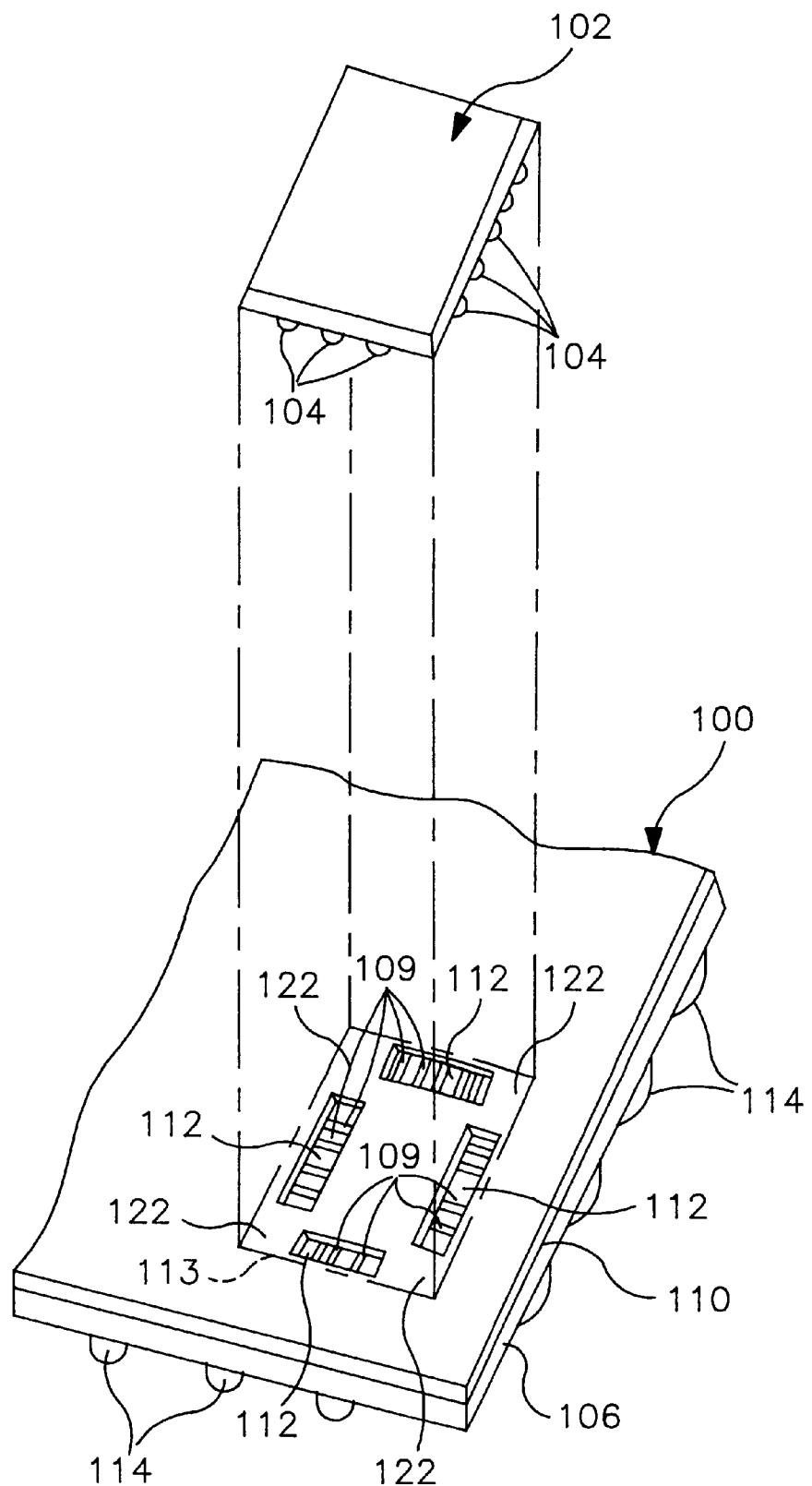
FIG. 12 is an exploded perspective view of a semiconductor chip mounted to a flip chip mounting substrate of the related art.
Figure 13:
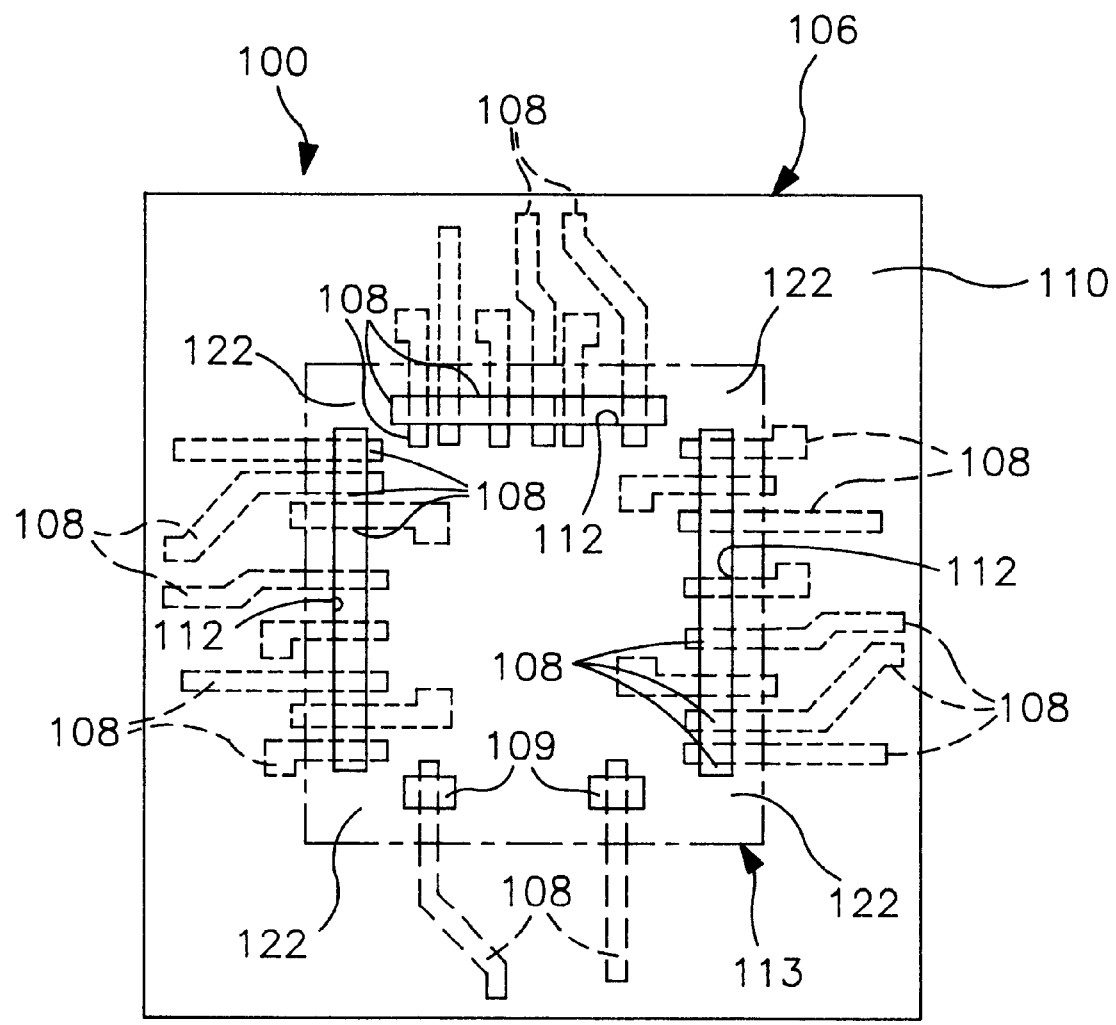
FIG. 13 is a plan view of a flip chip mounting substrate of the related art.
Figure 14:
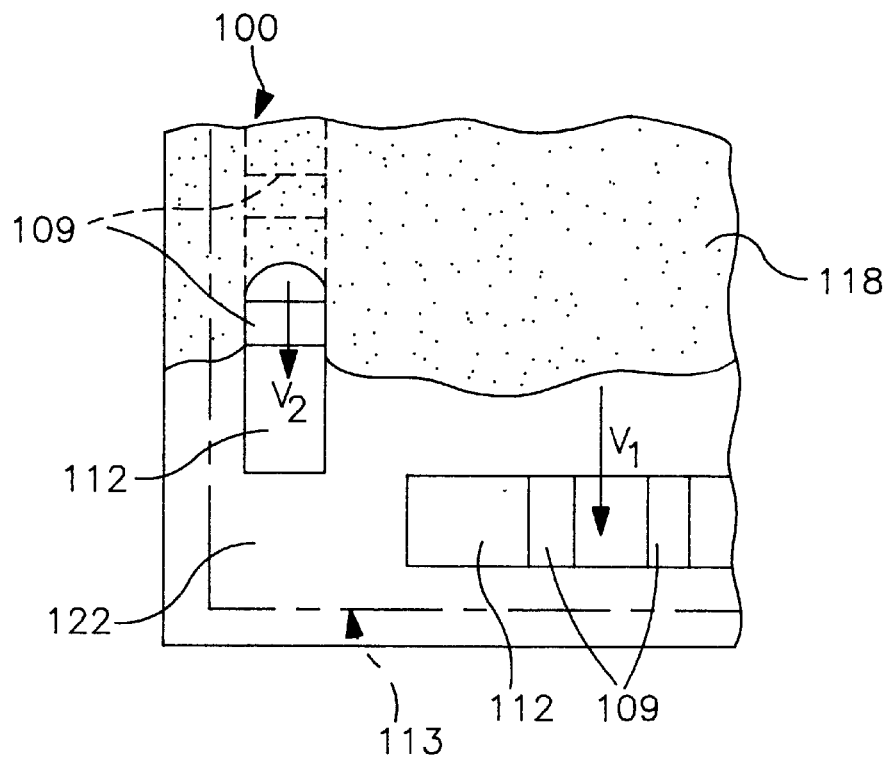
FIG. 14 is a diagram for explaining flow of under-fill resin of the related art.
Figure 15:
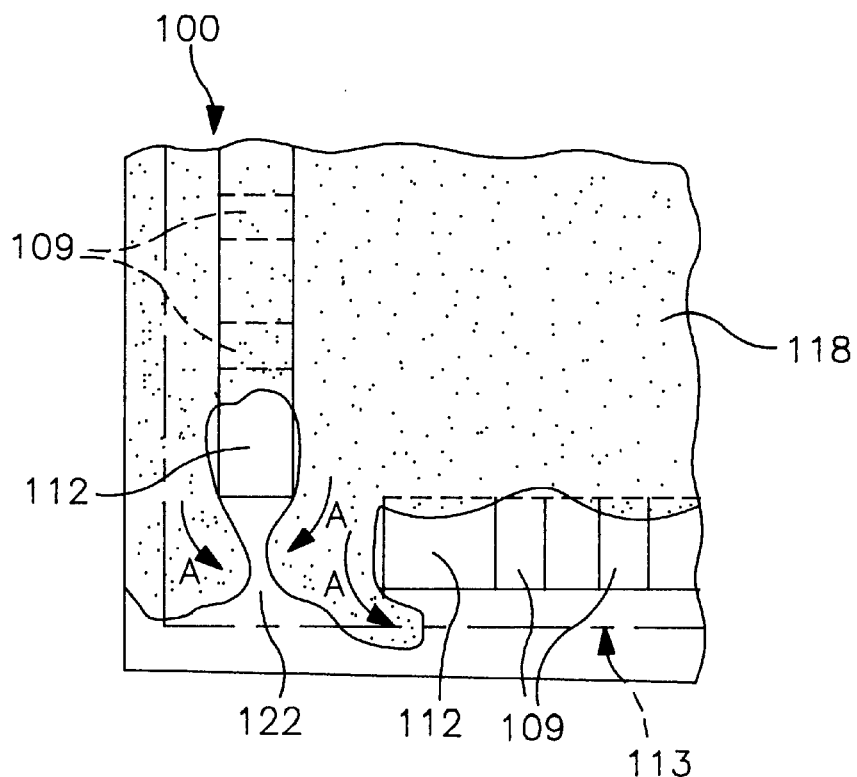
FIG. 15 is a diagram illustrating flow of under-fill resin of the related art.
Figure 16:
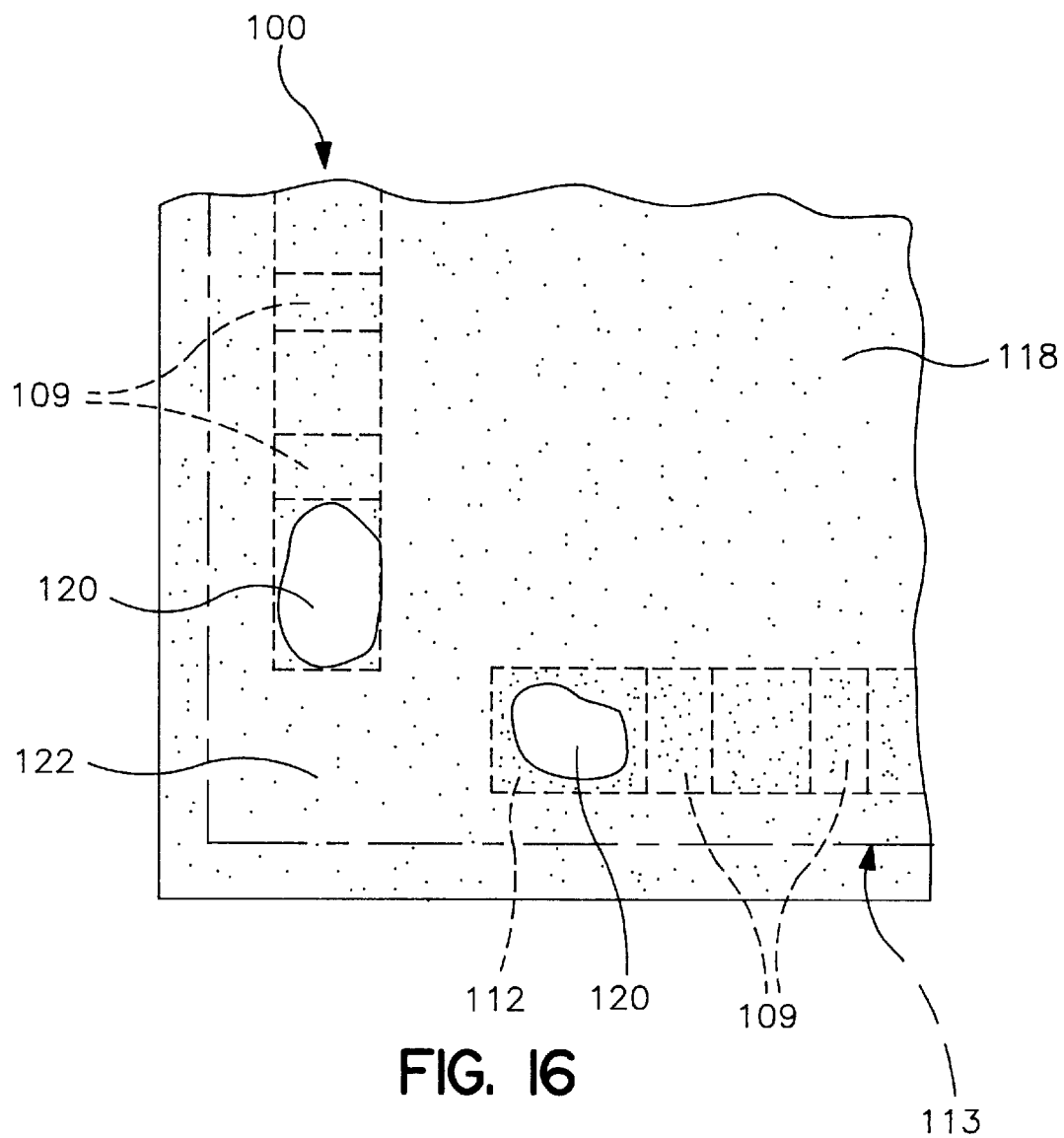
FIG. 16 is a diagram illustrating flow of under-fill resin of the related art.

The structure of aperture 22 will now be explained in comparison with the mounting substrate 100 of the related art (see FIG. 12). Aperture 22 is formed by removing, for example, solder resist 110 of FIG. 12 for each corner area for four apertures 112 and then coupling the four apertures 112.

Moreover, this embodiment of FIG. 4A is characterized in that the aperture 22 is extended about an external side of mounted semiconductor chip 12 (not shown). However, an external position of semiconductor chip 12 is indicated by broken line 32 within the aperture 22.

Therefore, when semiconductor chip 12 is mounted to mounting substrate 10, the aperture 22 is extended beyond the external side of the chip external position 32 of the semiconductor chip 12. Moreover, the area where the aperture 22 is extended beyond the external side from chip external position 32 is set to 0.05 mm or more, and within 0.3 mm for the external side from the chip external position 32 of the semiconductor chip 12. The effect of this structure will be explained later.

Figure 4B:
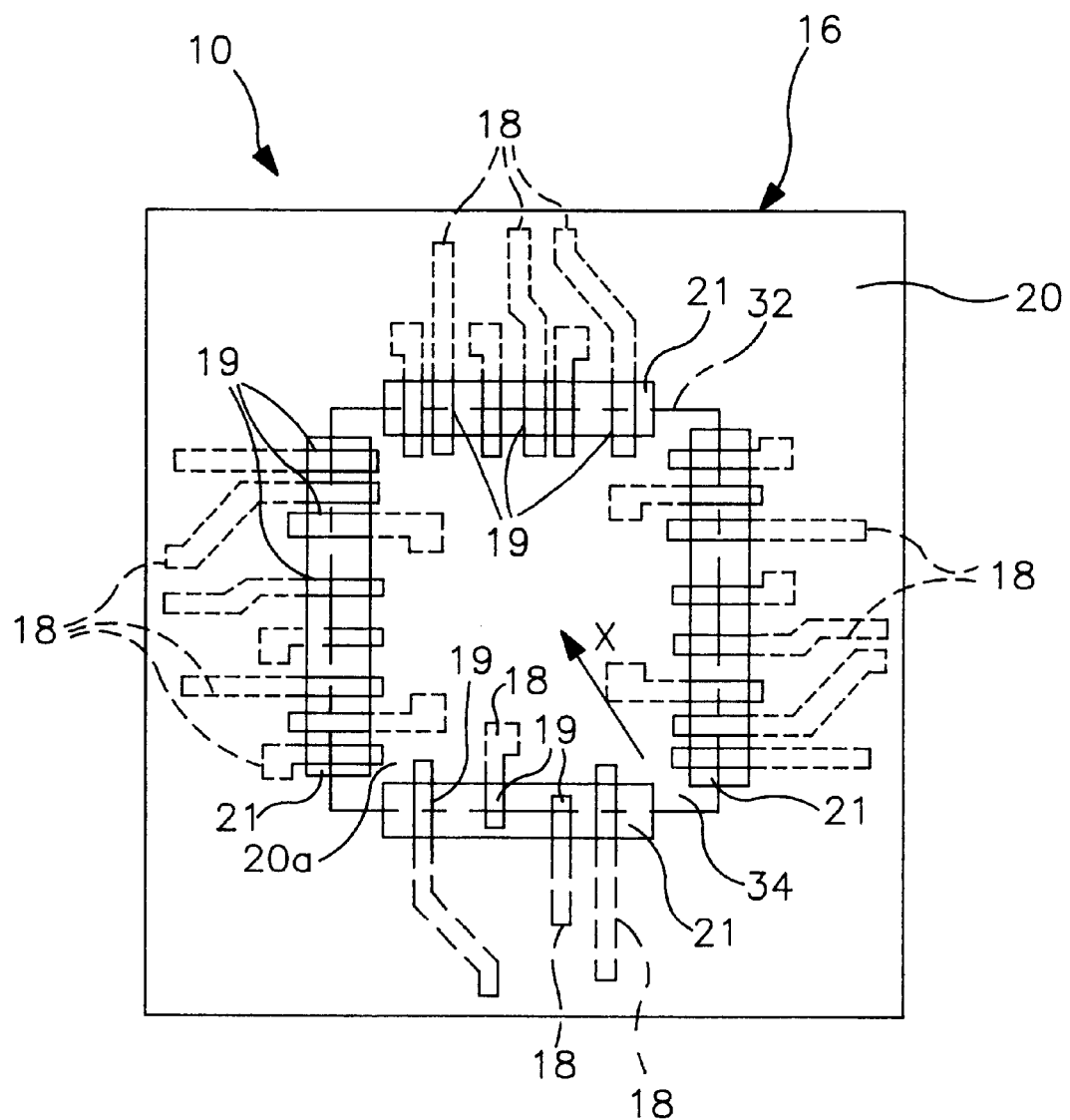

The embodiment illustrated in FIG. 4B emphasizes that each aperture is not continuous and is formed by respectively independent exposed portions 21. More particularly, a corner portion 34 which is formed as a part of solder resist 20 is provided between adjacent exposed portions 21 and thereby each exposed portion 21 is respectively independent. In addition, exposed portions 21 extend up to the external side 32 for mounted semiconductor chip 12 when the semiconductor chip is mounted on substrate 10.

Figure 4C:
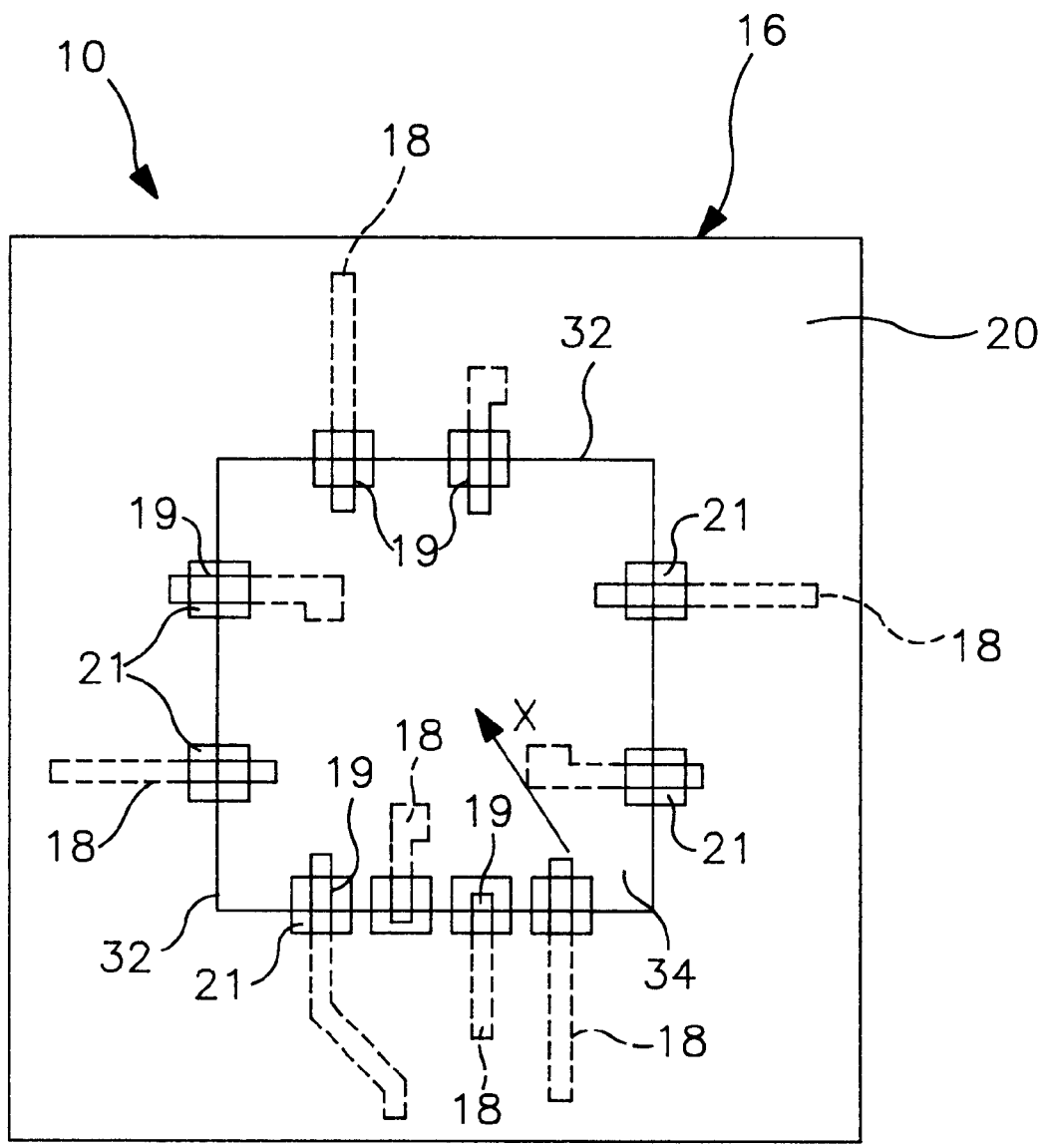

The embodiment of FIG. 4C illustrates that each aperture is formed from independent exposed portions 21 which extend up to external side 32 of mounted semiconductor chip 12. Exposed portions 21 are disposed between chip external position 32 and an outer edge of pad 19 when semiconductor chip 12 is mounted on mounting substrate 10.

The common effect of the structures illustrated in FIGS. 4A through 4C is that even if a void occurs in the under-fill resin during a later process, the void is pushed away from the under-fill resin through the exposed portions 21. Since the exposed portions 21 are an escape route of the void, there is no void in the under-fill resin when the structures illustrated in FIGS. 4A through 4C are combined.

By the way, an internal area 20a of solder resist 20 is formed at an internal side of the aperture 22 by forming aperture 22 as illustrated in FIGS. 4B and 4C. When internal area 20a, is formed, the wiring layer connected to pad 19 may also be formed at a lower part of the internal area 20a and thereby a high density wiring layer can be obtained.

When a structure including pad 19 is formed without providing resist to an area corresponding to the internal area 20a, the solder precoat does not become uniform and the mounting characteristics can be disturbed. The insulation property for the pad 19 is also disturbed.

However, the insulation property for pad 19 may be maintained, even when pad 19 is formed at a lower part of internal area 20a, by forming internal area 20a inside of aperture 22. Moreover, a wide arrangement area may be obtained for the pad 19, and accordingly, a degree of freedom in pattern design of pad 19 can also be improved.

Subsequently, flow of the under-fill resin 28 generated on the mounting substrate 10 when the mounting substrate 10 is filled with the under-fill resin 28 will be explained.

FIG. 5 through FIG. 8 illustrate changes with respect to time of under-fill resin 28 being supplied to an area between semiconductor chip 12 and mounting substrate 10. Each figure respectively shows an enlarged condition of a corner area of the mounting substrate 10. Moreover, under-fill resin 28 is supplied to the area between the semiconductor chip 12 and mounting substrate 10 from a resin supplying area, i.e. corner portion 34 (see FIG. 4) provided at one corner of the aperture 22. Moreover, the supplying direction of the under-fill resin 28 is indicated by an arrow X in FIG. 4A. According to FIGS. 5 through 8, aperture 22 is coupled with a coupling means 22c to form a circumferential shape, i.e circumferential aperture 22 itself.

The arrangement position of the resin supplying area 34 is not limited to the corner area of the aperture 22, and may also be provided to one external side of aperture 22. Moreover, since a resin supply area is provided at one external side or one corner of the aperture, resin flow may be stabilized.

The inventors of the present invention have supplied, as an experiment, the under-fill resin 28 to an area between the mounting substrate 10 and semiconductor chip 12 of this embodiment to know how the under-fill resin 28 changes flow with respect to time.

Figure 5:
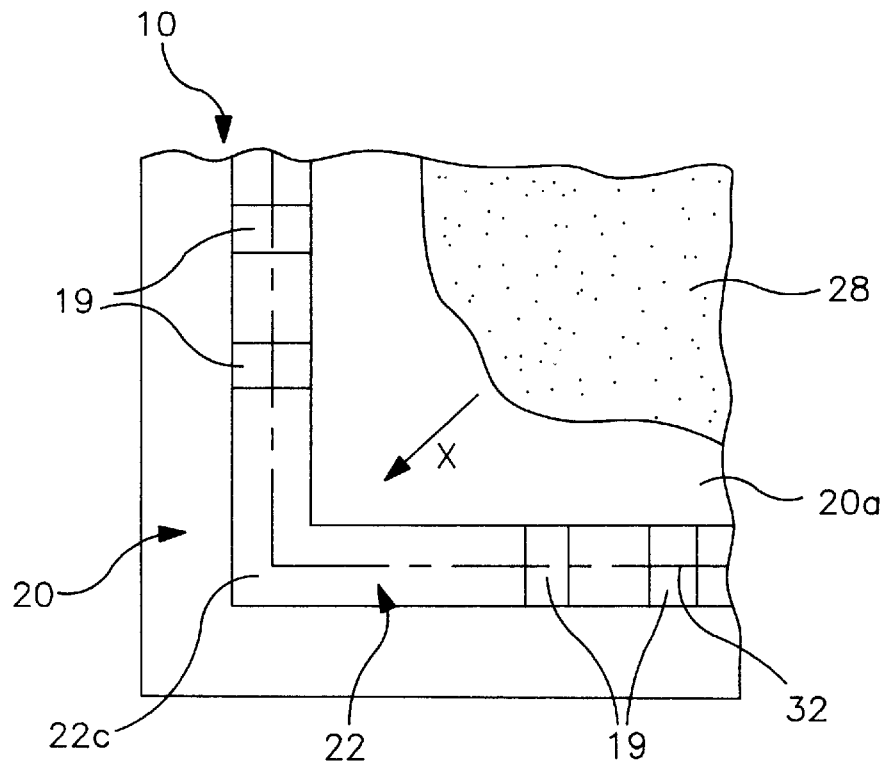
FIG. 5 is a diagram illustrating flow of under-fill resin according to a preferred embodiment of the present invention.

As explained above, the flow rate of the under-fill resin 28 is different depending on the place, and the flow rate of the under-fill resin 28 on the solder resist 20 (internal area 20*a*) is higher inside aperture 22. Therefore, when the under-fill resin 28 is supplied in the direction of X from the resin supplying area 34, the under-fill resin 28 flows through the internal area 20*a* in the direction of arrow X as illustrated in FIG. 5.

Figure 6:
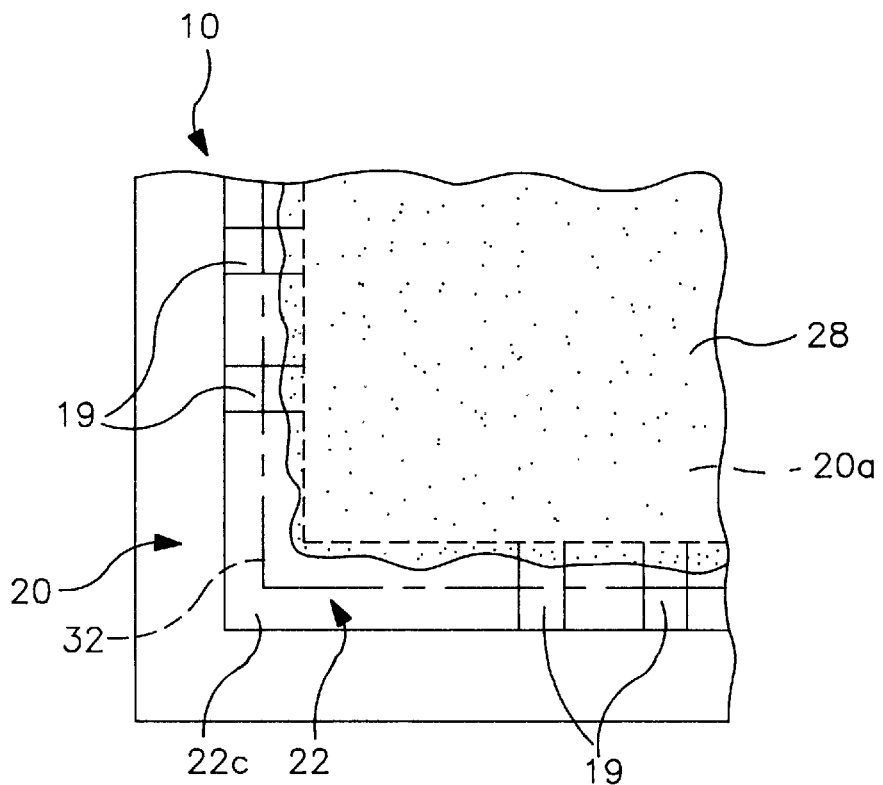
FIG. 6 is a diagram illustrating flow of under-fill resin according to a preferred embodiment of the present invention.

In this case, the air (hereinafter, referred to as internal air) existing in an area between semiconductor chip 12 and mounting substrate 10 is pushed by under-fill resin 28 and then released to the outside from the area between semiconductor chip 12 and mounting substrate 10. In FIG. 6, under-fill resin 28 has not reached chip external position 32.

Figure 7:
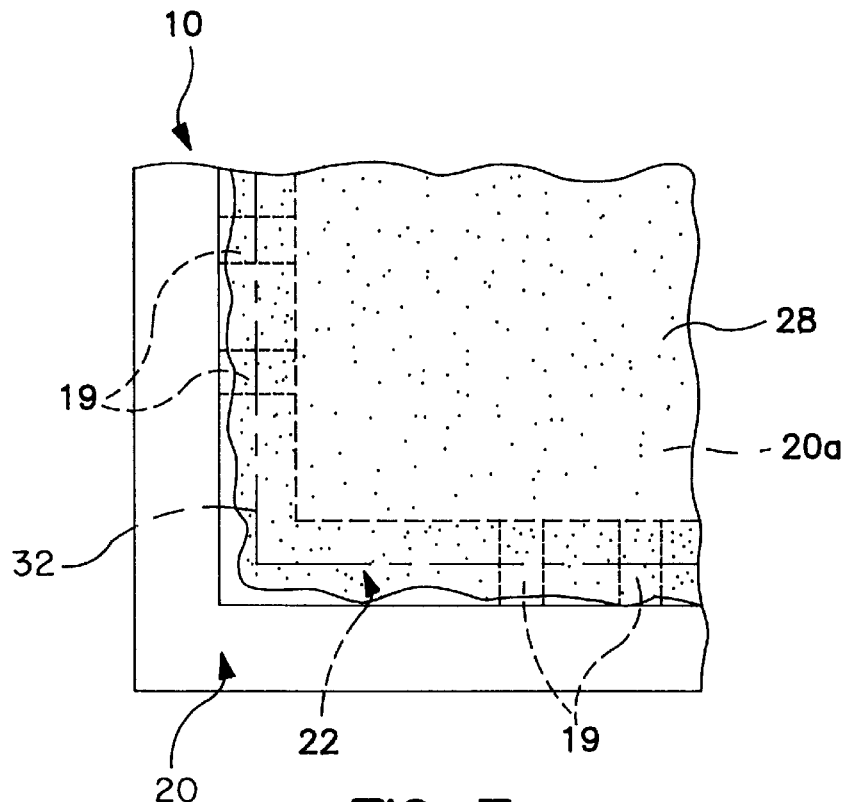
FIG. 7 is a diagram illustrating flow of under-fill resin according to a preferred embodiment of the present invention.

When the under-fill resin 28 further proceeds in the direction X, a flow rate difference explained above is maintained and the under-fill resin 28 flowing in the internal area 20*a* almost simultaneously reaches the internal edges of aperture 22, and then travels further. Thus, as shown in FIG. 6, the under-fill resin 28 enters the inside of the aperture 22. Thereafter, under-fill resin 28 travels inside aperture 22 and finally reaches an external side of chip external position 32, as shown in FIG. 7.

In this case, as explained previously, since under-fill resin 28 extends up to the external side of the chip external position 32, generation of local turning-over of the under-fill resin 28 can be controlled.

Moreover, since the turning-over of the under-fill resin 28 can be controlled, the internal air pushed with progress of the under-fill resin 28 is not constricted and can be released to the outside from an area between semiconductor chip 12 and mounting substrate 10. Thereby, generation of a void between semiconductor chip 12 and mounting substrate 10 can be prevented, to thereby assure stability and reliability of the mounting structure. Particularly, when the extending area of the aperture 22 is set at its external side to the range of 0.05 mm to 0.3 mm from the chip external position 32 of the semiconductor chip 12, generation of a void can effectively be controlled.

Moreover, since the aperture is formed as a circumference aperture by forming the aperture to surround the external circumference of the surface mounting element, generation of diffusion of resin at any position of the external circumference of the surface mounting element can be controlled and thereby generation of a void can be prevented.

Moreover, since a region of the aperture extends up to an external side from an external shape of the surface mounting element in the range from 0.05 mm to 0.3 mm in the external direction of the external circumference of the surface mounting element, generation of a void can effectively be controlled and lowering of the element mounting density can also be controlled.

Figure 8:
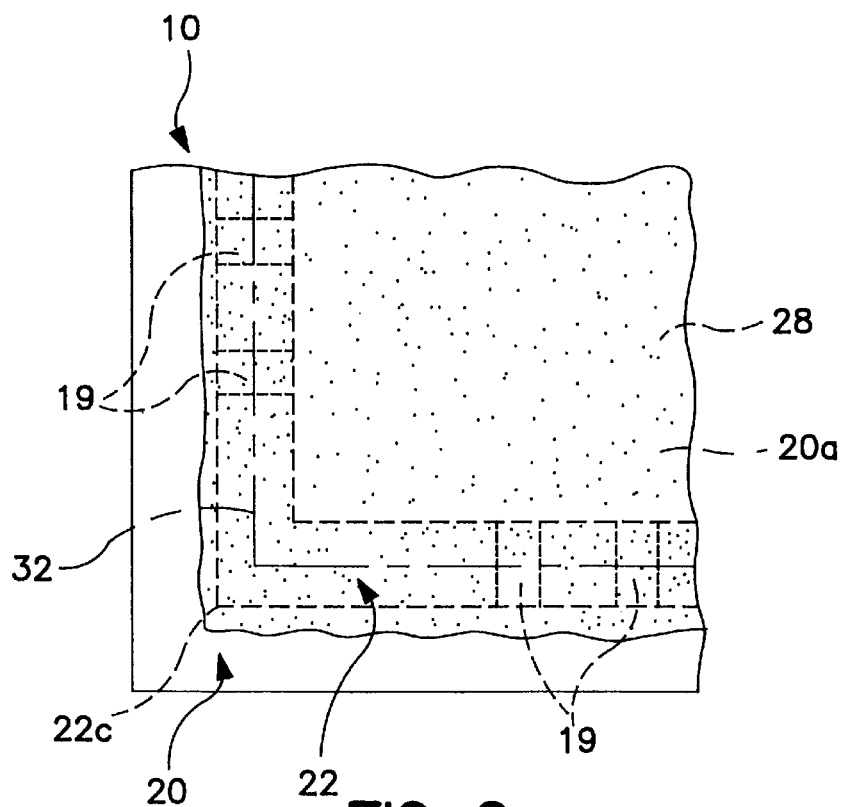
FIG. 8 is a diagram illustrating flow of under-fill resin according to a preferred embodiment of the present invention.
Figure 9:
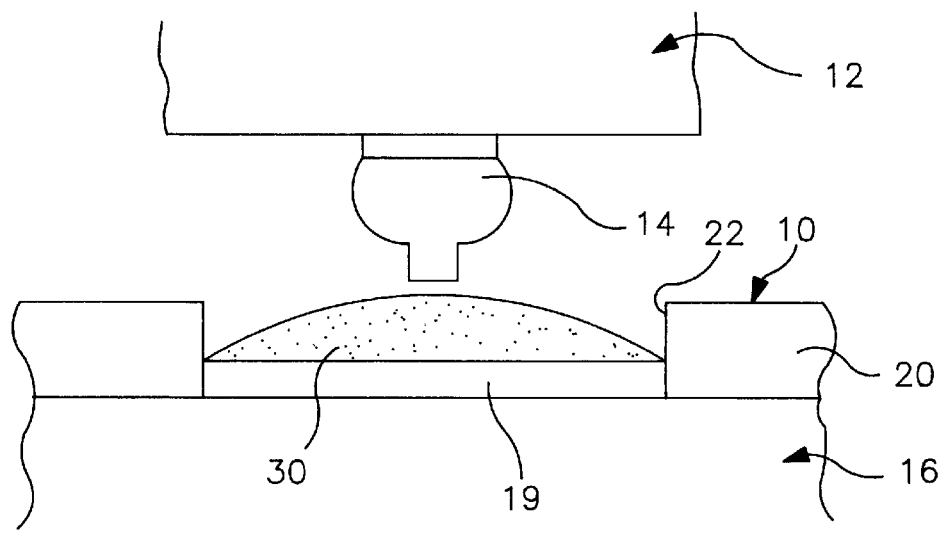
FIG. 9 is a cross-sectional view of a solder precoat operation according to a preferred embodiment of the present invention.
Figure 10:
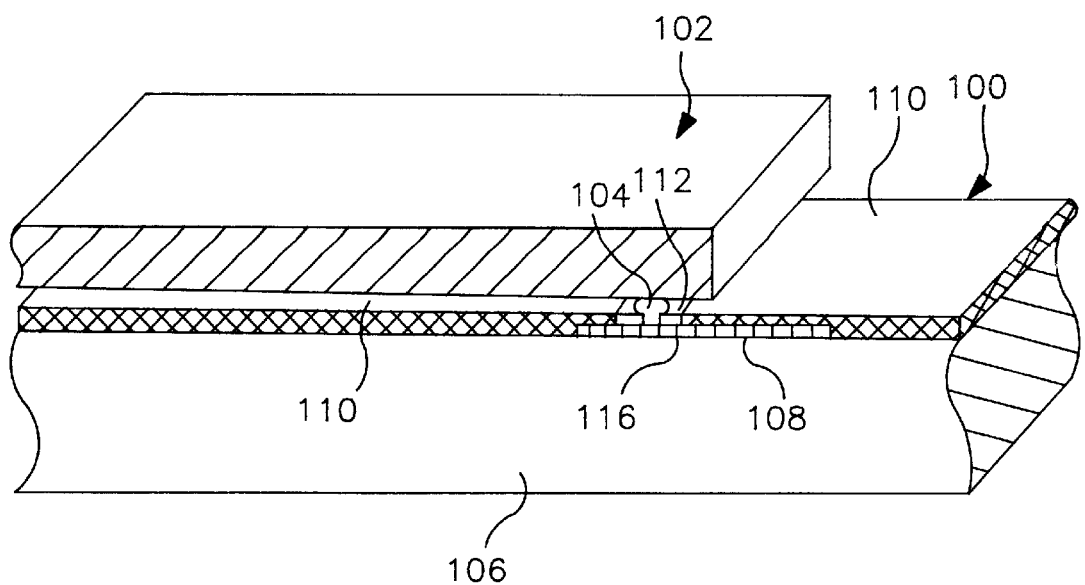
FIG. 10 is a side cross-sectional view of a semiconductor chip mounted to a flip chip mounting substrate of the related art.
Figure 11:
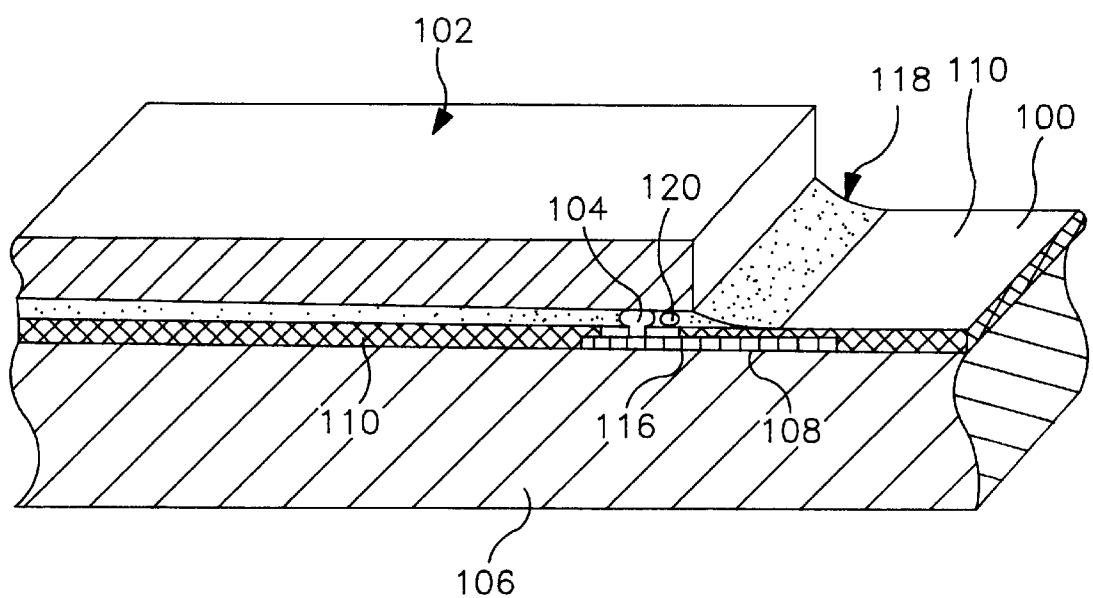
FIG. 11 is a cross-sectional view of a semiconductor chip mounted with under-fill resin being supplied to a flip chip mounting substrate of the related art.

Moreover, in this embodiment, it is also possible that the under-fill resin 28 is continuously supplied after it has reached the chip external position 32 and thereby an end part of the under-fill resin 28 is extended beyond the external side from the external circumferential edge of the aperture 22, as shown in FIG. 8.

Here, in the embodiment explained above, a printed circuit board is used as substrate body 16 and solder resist 20 is used as the insulation film. However, a combination of materials of the substrate body 16 and insulation film is not limited only to that explained above. For example, it is possible to use a ceramic substrate as the substrate body 16 and alumina coat as the insulation film.

Although a few preferred embodiments of the present invention have been shown and described, it will be appreciated by those skilled in the art that changes may be made in these embodiments without departing from the principles and spirit of the invention, the scope of which is defined in the claims and their equivalents.

What is claimed is:

1. A semiconductor device to receive a chip having an outer circumference which defines a chip external position, comprising:

a substrate having first and second portions with an external terminal formed on the first portion;

a plurality of pads disposed on the second portion and electrically connected to the external terminal; and an insulation layer formed on a part of said pads and defining a ring aperture separating the insulation layer into a first insulation layer portion and a second insulation portion to expose a portion of said pads for electrical connection with the chip, wherein the chip external position is between the first insulation layer and the second insulation layer.

2. The semiconductor device according to claim 1, wherein the ring aperture is separated at a portion of a corner of the chip.

3. The semiconductor device according to claim 1, further comprising a plurality of wiring layers disposed under said insulation layer to electrically connect the external terminal to the pads.

4. The semiconductor device according to claim 1, wherein a resin injecting area is disposed at one side or one corner of an external area about the aperture for injecting resin between said substrate and the chip.

5. The semiconductor device according to claim 1, wherein said plurality of pads are provided with a solder and formed linearly with uniform width.

6. The semiconductor device according to claim 1, wherein said substrate is a printed circuit board.

7. The semiconductor device according to claim 1, wherein said insulation layer is formed of a solder resist.

8. The semiconductor device according to claim 1, wherein said plurality of pads electrically connect to the chip with a corresponding plurality of gold bumps.

9. The semiconductor device according to claim 1, wherein the aperture is greater than 0.05 mm in width.

10. The semiconductor device according to claim 1, wherein the aperture extends beyond the external chip position in the range from 0.05 mm to 0.3 mm.

11. A semiconductor substrate to receive a chip having an outer circumference which defines a chip external position on said semiconductor substrate, comprising:

an external terminal formed on a first portion of the semiconductor substrate;

a plurality of pads disposed on a second portion of the semiconductor substrate and electrically connected to the external terminal; and an insulation layer formed on a part of said pads and defining a ring aperture separating the insulation layer into a first insulation layer portion and a second insulation portion to expose a portion of said pads for electrical connection with the chip, wherein the chip external position is between the first insulation layer and the second insulation layer.

12. The semiconductor substrate according to claim 11, wherein the ring aperture is separated at a portion of a corner of the chip.

13. The semiconductor substrate according to claim 11, further comprising a plurality of wiring layers disposed under said insulation layer to electrically connect the external terminal to the pads.

14. A semiconductor device to receive a chip having an outer circumference which defines a chip external position, comprising:

a substrate having first and second portions with an external terminal formed on the first portion;

a plurality of pads disposed on the second portion and electrically connected to the external terminal;

an insulation layer formed on a part of said pads and defining a ring aperture separating the insulation layer into a first insulation layer portion and a second insulation portion to expose a portion of said pads for electrical connection with the chip; and an under fill resin injected between said substrate and the chip, wherein the chip external position is between the first insulation layer and the second insulation layer such that said under fill resin does not form a void during injection between said substrate and the chip.

15. A semiconductor device to receive a chip having an outer circumference which defines a chip external position, comprising:

a substrate having first and second portions with an external terminal formed on the first portion;

a plurality of pads disposed on the second portion and electrically connected to the external terminal;

an insulation layer formed on a part of said pads and defining a ring aperture separating the insulation layer into a first insulation layer portion and a second insulation portion to expose a first portion and a second portion of said pads for electrical connection with the chip; and an underfill resin injected between said substrate and the chip, wherein the chip external position is between the first insulation layer and the second insulation layer such that said underfill resin does not form a void during injection between said substrate and the chip.

* * * * *

UNITED STATES PATENT AND TRADEMARK OFFICE
CERTIFICATE OF CORRECTION

PATENT NO.:   6,049,122
DATED     :   April 11, 2000
INVENTOR(S):  Yoshihiro Yoneda It is certified that error appears in the above-identified patent and that said Letters Patent is hereby corrected as shown below:

Title Page,   [56] References Cited, FOREIGN PATENT DOCUMENTS, change "8-097313   12/1996" to --8-097313   04/1996--.

Column 11,   line 13, (claim 14), change "under fill" to --underfill--.

Signed and Sealed this

Twenty-seventh Day of March, 2001

Attest:

NICHOLAS P. GODICI

Attesting Officer    Acting Director of the United States Patent and Trademark Office